(12) United States Patent
Yano et al.

(10) Patent No.: US 8,339,766 B2
(45) Date of Patent: Dec. 25, 2012

(54) METHOD OF MANUFACTURING THIN FILM CAPACITOR AND THIN FILM CAPACITOR

(75) Inventors: Yoshihiko Yano, Tokyo (JP); Yasunobu Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 279 days.

(21) Appl. No.: 12/731,398

(22) Filed: Mar. 25, 2010

(65) Prior Publication Data
US 2010/0246089 A1  Sep. 30, 2010

(30) Foreign Application Priority Data

Mar. 31, 2009 (JP) ............... P2009-086883
Nov. 10, 2009 (JP) ............... P2009-257238

(51) Int. Cl.
*H01G 4/228* (2006.01)
(52) U.S. Cl. ............. 361/306.1; 361/311; 361/313; 361/306.3; 361/321.1; 361/305
(58) Field of Classification Search ............ 361/311, 361/312–313, 321.1, 321.2, 303–305, 306.1, 361/306.3; 438/3, 240, 608
See application file for complete search history.

(56) References Cited

U.S. PATENT DOCUMENTS

| | | | |
|---|---|---|---|
| 6,146,906 A * | 11/2000 | Inoue et al. | 438/3 |
| 6,462,933 B2 | 10/2002 | Takeshima et al. | |
| 7,078,288 B2 * | 7/2006 | Ashikaga | 438/240 |
| 7,539,005 B2 | 5/2009 | Uchida et al. | |
| 7,561,406 B2 | 7/2009 | Saita et al. | |
| 2008/0010798 A1 | 1/2008 | Borland et al. | |

FOREIGN PATENT DOCUMENTS

| | | |
|---|---|---|
| JP | A-56-144523 | 11/1981 |
| JP | A-8-78283 | 3/1996 |
| JP | A-9-213569 | 8/1997 |
| JP | A-2001-217142 | 8/2001 |
| JP | A-2007-59896 | 3/2007 |
| JP | A-2007-207948 | 8/2007 |
| JP | A-2007-294937 | 11/2007 |
| JP | A-2008-109082 | 5/2008 |

OTHER PUBLICATIONS

Yoneda, Y. et al., "Preparation and Characterization of Ultra Thin Chip Capacitor," Carts Europe 2006:The 20$^{th}$ Annual Passive Components Symposium, Sep. 25-28, 2006, pp. 273-280.

* cited by examiner

*Primary Examiner* — Nguyen T Ha
(74) *Attorney, Agent, or Firm* — Oliff & Berridge, PLC (57) ABSTRACT

A method of manufacturing a thin film capacitor, having: a base electrode; dielectric layers consecutively deposited on the base electrode; an internal electrode deposited between the dielectric layers; an upper electrode deposited opposite the base electrode with the dielectric layers and the internal electrode being interposed therebetween; and a cover layer deposited on the upper electrode, has depositing an upper electrode layer which is to be the upper electrode, and a cover film which is to be the cover layer on the unsintered dielectric film which is to be the dielectric layer, to fabricate a lamination component, and sintering the lamination component.

3 Claims, 10 Drawing Sheets

METHOD OF MANUFACTURING THIN FILM CAPACITOR AND THIN FILM CAPACITOR

BACKGROUND OF THE INVENTION

1. Field of the Invention

This invention relates to a method of manufacturing a thin film capacitor, and to a thin film capacitor.

2. Related Background Art

Thin film capacitors are for example placed in electrical circuits which operate at high speeds, and are preferably used as large-capacitance capacitors for shunting high-frequency noise, preventing fluctuations in power supply voltages, and in similar applications. In recent years there have been demands for use of thin film capacitors in proximity to devices such as integrated circuits and light-emitting elements, to cause devices to operate more rapidly; addressing this need is, for example, the technology disclosed in Japanese Patent Application Laid-open No. 2007-207948.

Specifically, the disclosure of Japanese Patent Application Laid-open No. 2007-207948 is technology which takes into consideration the damage due to oxidation of electrode layers in a process of sintering to cause crystallization of a dielectric layer in order to obtain a large permeability, and provides an oxide film removal process of removing oxidized regions of electrode layers after sintering.

SUMMARY OF THE INVENTION

However, in cases in which oxidized regions cannot be adequately removed by a process for removal of oxide film after sintering as described in Japanese Patent Application Laid-open No. 2007-207948, oxidized regions remain in electrode layers, so that there is the problem that the electrostatic capacitance tends to be reduced. Further, by performing an oxide film removal process after sintering, tasks relating to manufacturing thin film capacitors become complex, and manufacturing costs are increased.

With the foregoing in view, it is an object of the present invention to provide a method of manufacturing a thin film capacitor by a more simple method in which oxidation of the upper electrode is suppressed, and resulting in a large electrostatic capacitance, and such a thin film capacitor.

In order to attain the above object, a method of manufacturing a thin film capacitor according to one aspect of the present invention is a method of manufacturing a thin film capacitor having a base electrode, a dielectric layer deposited on the base electrode, an upper electrode deposited opposite the base electrode with the dielectric layer being interposed therebetween, and a cover layer deposited on the upper electrode, the method comprising; fabricating a lamination component comprising an unsintered dielectric film which is to be the dielectric layer on which an upper electrode layer which is to be the upper electrode and a cover film which is to be the cover layer are deposited; and sintering the lamination component.

Further, a thin film capacitor according to one aspect of the present invention is a thin film capacitor comprising a base electrode, a dielectric layer deposited on the base electrode, an upper electrode deposited opposite the base electrode with the dielectric layer being interposed therebetween, and a cover layer deposited on the upper electrode; wherein the thin film capacitor is formed by sintering a lamination component; and wherein the lamination component is formed by depositing an upper electrode layer which is to be the upper electrode and a cover film which is to be the cover layer on an unsintered dielectric film which is to be the dielectric layer.

By means of the above-described method of manufacturing a thin film capacitor and thin film capacitor, sintering is performed as a lamination component in which a cover film which is to be the cover layer is deposited on the upper electrode layer which is to be the upper electrode, so that oxidation of the upper electrode is suppressed. Hence formation of an oxidized region on the electrode is suppressed without providing an oxide film removal process, so that a thin film capacitor with a large electrostatic capacitance can be obtained by a more simple method. Also, by performing sintering after depositing the upper electrode layer which is to be the upper electrode and the cover film which is to be the cover layer on the unsintered dielectric Elm which is to be the dielectric layer, the number of sintering can be reduced, and the characteristics of the thin film capacitor can be improved.

Further, even when, rather than depositing the upper electrode layer which is to be the upper electrode and the cover film which is to be the cover layer on the unsintered dielectric film, the upper electrode layer and cover film are deposited on the dielectric film after sintering, and this is sintered, formation of an oxidized region on the electrode is suppressed by a more simple method, and a thin film capacitor with large electrostatic capacitance can be obtained.

That is, a method of manufacturing a thin film capacitor according to one aspect of the present invention is a method of manufacturing a thin film capacitor having a base electrode, a dielectric layer deposited on the base electrode, an upper electrode deposited opposite the base electrode with the dielectric layer being interposed therebetween, and a cover layer deposited on the upper electrode, the method comprising; fabricating a lamination component comprising a sintered dielectric film which is to be the dielectric layer on which an upper electrode layer which is to be the upper electrode and a cover film which is to be the cover layer are deposited; and sintering the lamination component.

Further, a thin film capacitor according to one aspect of the present invention is a thin film capacitor having a base electrode, a dielectric layer deposited on the base electrode, an upper electrode deposited opposite the base electrode with the dielectric layer being interposed therebetween, and a cover layer deposited on the upper electrode; wherein the thin film capacitor is formed by sintering a lamination component; and wherein the lamination component is formed by depositing an upper electrode layer which is to be the upper electrode and a cover film which is to be the cover layer on a sintered dielectric film which is to be the dielectric layer.

Here it is preferable that the cover film comprises a material with the same composition as the dielectric film, and it is preferable that the cover layer comprise a material with the same composition as the dielectric layer.

When the cover film which is to be the cover layer and the dielectric film which is to be the dielectric layer comprise material with the same composition, stresses arising when the cover layer and the dielectric layer comprise materials with different compositions can be reduced. By this means, the occurrence of deformation and other consequences of stresses in the layers comprised by the thin film capacitor can be suppressed, so that the occurrence of leakage currents can be suppressed, and a thin film capacitor with superior characteristics can be obtained.

Further, a method of manufacturing a thin film capacitor according to one aspect of the present invention can employ a mode of further comprising a process in which the sintered lamination component is patterned and a terminal electrode is provided. And, a thin film capacitor according to one aspect of the present invention can employ a mode of further comprising a terminal electrode provided by patterning the sintered lamination component.

A method of manufacturing a thin film capacitor and a thin film capacitor having high electrostatic capacitance can be provided in which a more simple method can be used to suppress oxidation of the upper electrode.

DESCRIPTION OF THE PREFERRED EMBODIMENTS

Embodiments of the present invention will now be described with reference to the accompanying drawings. In descriptions of the drawings, the same symbols are assigned to the same elements, and redundant descriptions are omitted.

(First Embodiment)

Thin Film Capacitor 100

Figure 1:
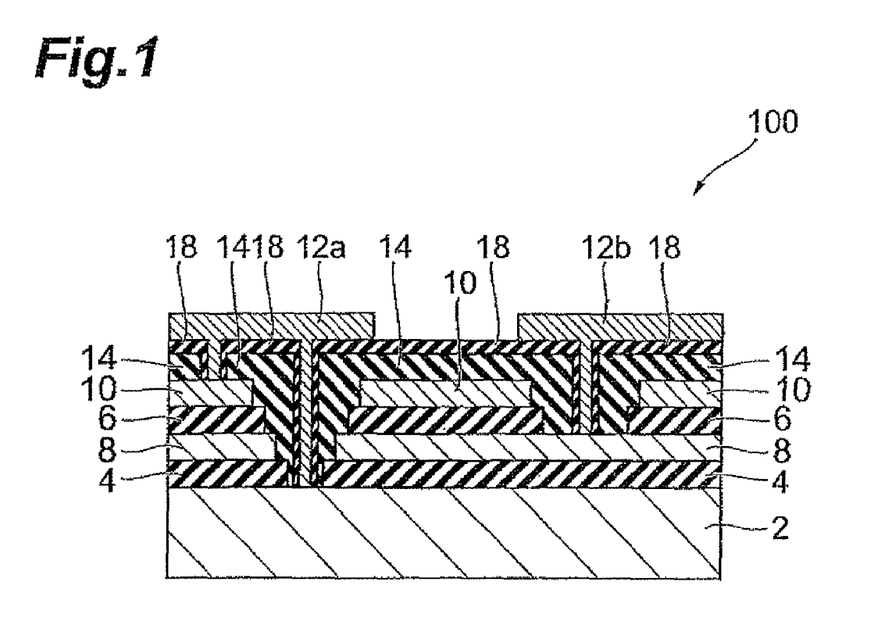
FIG. 1 is a summary cross-sectional view of the thin film capacitor of a first embodiment of the invention.

First, the thin film capacitor 100 of the first embodiment will be described. As shown in FIG. 1, the thin film capacitor 100 of this embodiment comprises a base electrode 2, dielectric layer 4 deposited on the base electrode 2, internal electrode 8 deposited on the dielectric layer 4, dielectric layer 6 deposited on the internal electrode 8, and upper electrode 10 deposited on the dielectric layer 6. That is, the thin film capacitor 100 comprises a base electrode 2, two &electric layers 4 and 6 deposited on the base electrode 2, an internal electrode 8 deposited between the dielectric layer 4 and the dielectric layer 6, and an upper electrode 10 deposited on the side opposite the base electrode 2 and enclosing the dielectric layers 4, 6 and the internal electrode 8. In the following, the direction of stacking in order of the base electrode 2, dielectric layer 4, internal electrode 8, dielectric layer 6, and upper electrode 10 is called the "deposition direction".

The thin film capacitor 100 comprises a pair of terminal electrodes 12a, 12b, on the side opposite the base electrode 2, which enclose the dielectric layer 4, internal electrode 8, dielectric layer 6, and upper electrode 10. The terminal electrode 12a, which is one among the pair of terminal electrodes 12a, 12b, is electrically connected to the base electrode 2 and to the upper electrode 10. The other terminal electrode 12b is electrically connected to the internal electrode 8. The pair of terminal electrodes 12a, 12b are electrically insulated from each other.

Also, the thin film capacitor 100 comprises an insulating cover layer 14, which fills the gap between the lamination body comprising the base electrode 2, dielectric layer 4, internal electrode 8, dielectric layer 6, and upper electrode 10, and the pair of terminal electrodes 12a, 12b. And, the thin. Elm capacitor 100 comprises an insulating protective layer 18 which covers the gap between the terminal electrodes 12a, 12b and the cover layer 14. Each of the portions comprised by the thin film capacitor 100 will now be described.

The base electrode 2 is formed from a conductive material. Specifically, as the conductive material forming the base electrode layer 20, an alloy comprising nickel (Ni) and platinum (Pt) as main components is preferable, and in particular an alloy comprising Ni as the main component is preferable for use. A higher purity for the Ni comprised by the base electrode 2 is preferable and 99.99 weight percent or higher is preferable. Minute amounts of impurities may be comprised by the base electrode 2. Impurities which can be comprised by the base electrode 2 comprising an alloy with Ni as the main component include, for example, iron (Fe), titanium (Ti), copper (Cu), aluminum (Al), magnesium (Mg), manganese (Mn), silicon (Si), chromium (Cr), vanadium (V), zinc (Zn), niobium (Nb), tantalum (Ta), yttrium (Y), lanthanum (La), cesium (Ce), or other transition metal elements or rare earth elements, as well as chlorine (Cl), sulfur (S), phosphorus (P), and similar. These impurities tend to cause shifts in the compositions of the dielectric layers 4, 6 or cause changes in the fine structure impeding crystal grain growth in crystallization of dielectric films upon diffusion from the base electrode 2 into the dielectric films in the sintering process of the thin film capacitor manufacturing method described below, resulting in reduced insulating resistance of the dielectric layers 4, 6 thus obtained. Shifts in the composition and changes in the fine structure of the dielectric layers 4, 6 may impede larger values of the electrostatic capacitance of the thin film capacitor 100.

It is preferable that the thickness of the base electrode 2 be from 5 to 100 μm, more preferable that the thickness be from 20 to 70 μm, and still more preferable that the thickness be approximately 30 μm. If the base electrode 2 is too thin, there is a tendency for the base electrode 2 to be difficult to handle during manufacturing of the thin film capacitor 100; if the base electrode 2 is too thick, there is a tendency for the effect of suppressing leakage currents to be reduced. The area of the base electrode 2 is for example approximately 1×0.5 mm². It is preferable that the above-described base electrode 2 comprise metal foil, serving as both substrate and as electrode. Thus a configuration is preferable in which the base electrode 2 of this embodiment also serve as a substrate; a substrate/electrode film structure, comprising a substrate of Si or aluminum or similar and an electrode comprising a metal film, may be used as the base electrode 2.

The dielectric layers 4 and 6 comprise $BaTiO_3$ (barium titanium oxide), $(Ba_{1-x}Sr_x)TiO_3$ (barium-strontium titanium oxide), $(Ba_{1-x}Ca_x)TiO_3$, $PbTiO_3$, $Pb(Zr_xTi_{1-x})O_3$, and other (strongly) dielectric materials having the perovskite structure; composite perovskite relaxer type ferroelectric materials, of which $Pb(Mg_{1/3}Nb_{2/3})O_3$ is representative; bismuth-layered compounds, of which $Bi_4Ti_3O_{12}$ and $SrBi_2Ta_2O_9$ are representative; and tungsten-bronze type ferroelectric materials, of which $(Sr_{1-x}Ba_x)Nb_2O_6$ and $PbNb_2O_6$ are representative. Here, in perovskite structure, perovskite relaxer type ferroelectric materials, bismuth-layered compounds, and tungsten-bronze type ferroelectric materials, the ratio of A sites to B sites is normally an integer ratio, but the ratio may be intentionally caused to deviate from an integer in order to improve characteristics. In order to control the characteristics of the dielectric layers 4 and 6, the dielectric layers 4 and 6 may comprise accessory components as added materials where appropriate.

The thicknesses of each of the dielectric layers 4 and 6 may for example be from 10 to 1000 nm. The areas of the dielectric layers 4 and 6 may for example be approximately 0.9×0.5 mm$^2$.

The internal electrode 8 provided enclosed by the above-described dielectric layers 4, 6 is formed from a conductive material. Specifically, a material comprising nickel (Ni) or platinum (Pt) as the primary component is preferably used as the internal electrode 8; Ni is particularly preferable. When using a material comprising Ni as the main component in the internal electrode 8, it is preferable that the content be 50 mol % or higher with respect to the entirety of the internal electrode 8. Further, when the main component of the internal electrode 8 is Ni, it is preferable that at least one type (hereafter called an "added element") selected from a group comprising platinum (Pt), palladium (Pd), iridium (Ir), rhodium (Rh), ruthenium (W), osmium (Os), rhenium (Re), tungsten (W), chromium (Cr), tantalum (Ta), and silver (Ag), be thither comprised. By inclusion of an added element in the internal electrode 8, interruption of the internal electrode 8 is prevented. The internal electrode 8 may comprise a plurality of types of added elements.

The thickness of the internal electrode 8 is for example approximately 10 to 1000 nm. The area of the internal electrode 8 is for example approximately 0.9×0.4 mm$^2$.

It is preferable that the upper electrode 10 comprise an alloy containing Ni as the main component. The upper electrode 10 may comprise impurities in minute amounts. Impurities which can be comprised by the upper electrode 10 include, for example, iron (Fe), titanium (Ti), copper (Cu), aluminum (Al), magnesium (Mg), manganese (Mn), silicon (Si), as well as chromium (Cr), vanadium (V), zinc (Zn), niobium (Nb), tantalum (Ta), yttrium (Y), lanthanum (La), cesium (Ce), and other transition metal elements or rare earth elements, as well as chlorine (Cl), sulfur (S), phosphorus (P), and similar. As the upper electrode 10, in addition to an alloy comprising Ni as the main component, Al, Cu, W, Cr, Ta, Nb or similar used in the wiring of Si semiconductors, display panels and similar, as well as Pt, Pd, Ir, Rh, Ru, Os, Re, Ti, Mn, Ag, and similar, can be used.

The dielectric layer 4 is interrupted in the cross-section of the thin film capacitor 100 shown in FIG. 1, but is continuous within a plane perpendicular to the deposition direction. Similarly, the dielectric layer 6, internal electrode 8, and upper electrode 10 are also each continuous within a plane perpendicular to the deposition direction.

The terminal electrodes 12a and 12b comprise, for example, Cu or another conductive material.

It is preferable that the cover layer 14 comprise the same material as the dielectric layers 4, 6. That is, BaTiO$_3$ (barium titanium oxide), (Ba$_{1-x}$Sr$_x$)TiO$_3$ (barium-strontium titanium oxide), (Ba$_{1-x}$Ca$_x$)TiO$_3$, PbTiO$_3$, Pb(Zr$_x$Ti$_{1-x}$)O$_3$, and other (strongly) dielectric materials having the perovskite structure; composite perovskite relaxer type ferroelectric materials, of which Pb(Mg$_{1/3}$Nb$_{2/3}$)O$_3$ is representative; bismuth-layered compounds, of which Bi$_4$Ti$_3$O$_{12}$ and SrBi$_2$Ta$_2$O$_9$ are representative; and tungsten-bronze type ferroelectric materials, of which (Sr$_{1-x}$Ba$_x$)Nb$_2$O$_6$ and PbNb$_2$O$_6$ are representative, are preferable. By forming the cover layer 14 using the same materials as the dielectric layers 4, 6, the occurrence of stresses with other layers in contact with the cover layer 14 (in particular the dielectric layers 4, 6 and similar) can be suppressed, so that there is the advantageous results of increased electrostatic capacitance and suppression of leakage currents. The material of the cover layer 14 is not limited to the above materials, and for example SiO$_2$, alumina, SiN (silicon nitride), and other insulating materials can be used.

The insulating protective layer 18 provided between the terminal electrodes 12a, 12b and the cover layer 14 comprises for example a polyimide or similar. By covering the cover layer with the insulating protective layer 18, leakage currents between the cover layer and the terminal electrodes 12a, 12b are suppressed. From the standpoint of leakage currents, it is preferable that an insulating protective layer 18 be provided between the terminal electrodes 12a, 12b and the cover layer 14, but an insulating protective layer 18 need not be provided.

Method of Manufacture of Thin Film Capacitor 100

Figure 2:
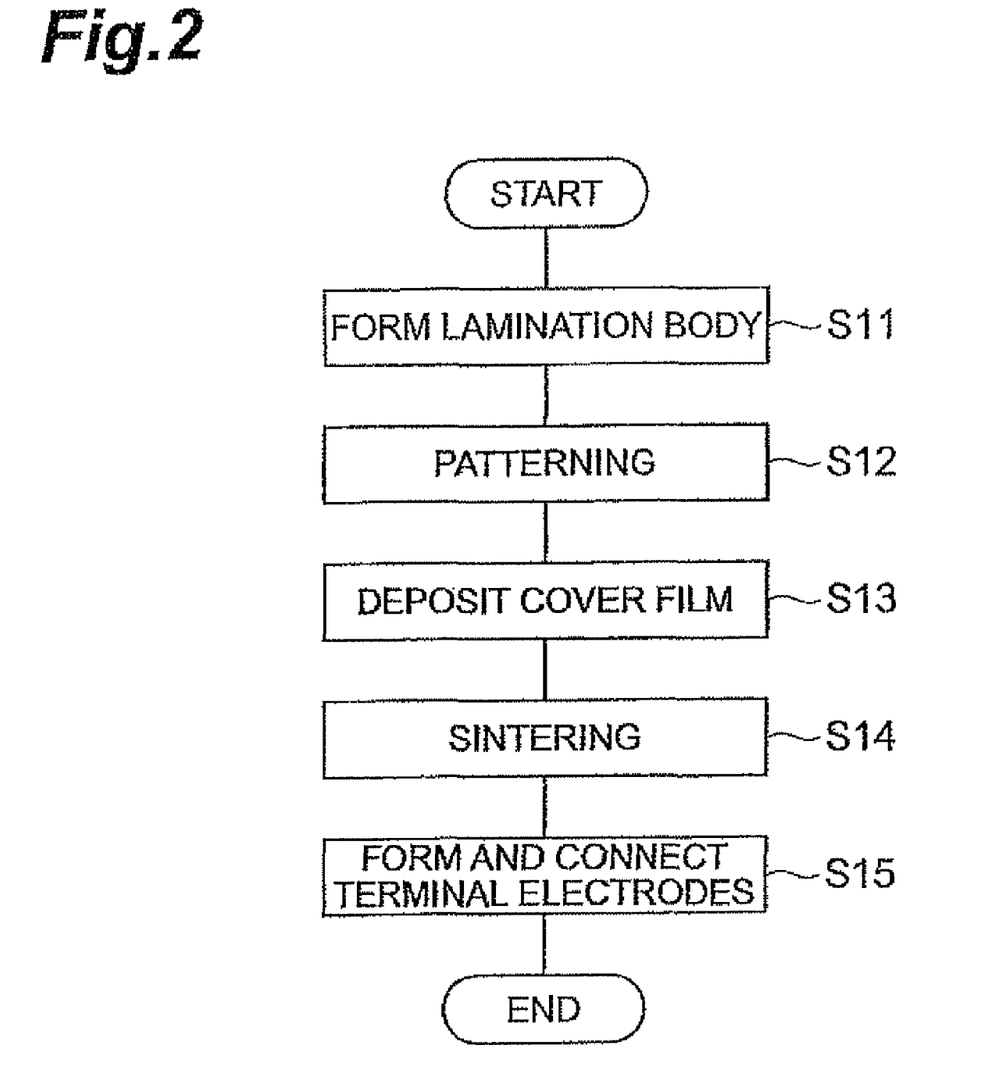
FIG. 2 is a flowchart explaining a method of manufacturing the thin film capacitor shown in FIG. 1.

Next, a method of manufacturing the thin film capacitor 100 of this embodiment will be described with reference to FIG. 2 and FIG. 3. FIG. 2 is a flowchart explaining the method of manufacturing the thin film capacitor 100 shown in FIG. 1, In FIG. 3, (a) through (c) are summary cross-sectional views showing a method of manufacturing the thin film capacitor 100 shown in FIG. 1. As shown in FIG. 2, the method of manufacturing the thin film capacitor 100 comprises a process of forming a lamination body (S11), a patterning process (S12), a cover film deposition process (S13), a sintering process (S14), and a terminal electrode formation and connection process (S15).

First, the process of forming a lamination body (S11) and the patterning process (S12) will be described. In these processes, the lamination body may first be formed (S11) and then patterned (S12), or a mask may be used when depositing each of the layers comprised by the lamination body in patterned formation, in a mode in which the lamination body formation (S11) and patterning (S12) are performed simultaneously. Or, etching may be used to perform patterning after formation of each of the layers comprised by the lamination body, without using a mask. In the following, a case will be described in which lamination body formation (S11) and patterning (S12) are performed simultaneously.

First, the base electrode 2 comprising metal foil is prepared. Where necessary, the metal foil is polished such that the surface has a prescribed arithmetic-mean roughness Ra. This polishing can be performed by CMP (Chemical-Mechanical Polishing), electrolytic polishing, buffing, or by other methods. Next, a dielectric film 4a is formed on the base electrode 2. The composition of this dielectric film 4a is similar to that of the dielectric layer 4 comprised by the completed thin film capacitor 100. As the method of formation of the dielectric film 4a, a solution method, a sputtering method or other PVD (Physical Vapor Deposition) or CVD (Chemical Vapor Deposition) method, or other film deposition technique can be used, but a sputtering method is preferable. Here, by pattern formation while using a mask, a patterned dielectric film 4a is formed as for example shown in (a) of FIG. 3.

Next, an internal electrode layer 8a is formed on the surface of the dielectric film 4a. The composition of the internal electrode layer 8a is similar to that of the first internal electrode 8 comprised by the completed thin film capacitor 100. Here, by pattern formation while using a mask, the patterned internal electrode layer 8a with the pattern shown in (a) of FIG. 3 is formed. As the method of formation of the internal electrode layer 8a, DC sputtering or similar may be used.

Then, a dielectric film 6a is formed on the surface of the internal electrode layer 8a. Here, by pattern formation while using a mask, the dielectric film 6a with the pattern shown in (a) of FIG. 3 is fowled. The composition of the dielectric film 6a is similar to that of the dielectric layer 6 comprised by the completed thin film capacitor 100. The method of formation of the dielectric film 6a is similar to that of the dielectric film 4a.

Then, an upper electrode layer 10a comprising an Ni alloy is formed on the surface of the dielectric film Ga. Here, by pattern formation while using a mask, the upper electrode layer 10a with the pattern shown in (a) of FIG. 3 is formed. By this means, a lamination body 100a is obtained, in which are deposited in order the base electrode 2, dielectric film 4a, internal electrode layer 8a, dielectric film 6a, and upper electrode layer 10a. As the method of formation of the upper electrode layer 10a, DC sputtering or similar may be used.

Next, a cover film 14a is formed so as to cover the surfaces of the base electrode 2, dielectric film 4b, internal electrode layer 8a, dielectric film 6b, and upper electrode layer 10a of this lamination body 100a (S13, cover film deposition process). It is preferable that the cover film 14a fowled here be of material having the same composition as the dielectric films 4a, 6a. By forming the cover film 14a, the lamination body (lamination component) 100b shown in (b) of FIG. 3 is formed.

Thereafter, the lamination body 100b, comprising the dielectric films 4a, 6a and the cover film 14a, is sintered (814, sintering process). It is preferable that the temperature during sintering be a temperature at which sintering (crystallization) of the dielectric films 4a, 6a occurs; specifically, 500 to 1000° C. is preferable. The sintering time may be approximately 5 minutes to 2 hours. No limitations in particular are placed on the atmosphere during sintering, and any among an oxidizing atmosphere, a reducing atmosphere, or a neutral atmosphere may be employed; however, it is preferable that sintering be performed at an oxygen partial pressure such the base electrode 2 is not oxidized. By this means, the dielectric layer 4, dielectric layer 6, and cover layer 14 are formed. As described above, after depositing the upper electrode layer 10a and the cover film 14a, in this order, on the dielectric film 6a which becomes the dielectric layer 6 in contact with the upper electrode 10, by then sintering this dielectric film 6a, formation of an oxide film at the interface between the upper electrode 10 and the dielectric layer 6 and at the interface between the upper electrode 10 and the cover layer 14 is suppressed. Further, by performing at one time the sintering of the dielectric film 6a and the sintering of the cover film 14a, the number of sintering can be reduced, and moreover by subjecting the dielectric film 6a, the upper electrode layer 10a and the cover film 14a to simultaneous heat treatment at high temperature, the surfaces thereof enter a stable state, and characteristics are improved.

Next, formation and connection of terminal electrodes to the sintered lamination body are performed (S15, terminal electrode formation and connection process). Specifically, as shown in the lamination body 100c of (c) in FIG. 3, at least a portion of the cover layer 14 is removed. Then, the pair of terminal electrodes 12a, 12b are formed on the lamination body 100c. One of the terminal electrodes 12a is electrically connected to the base electrode 2 and upper electrode 10 through a via, and the other terminal electrode 12b is electrically connected to the internal electrode 8 through a via. Also, annealing treatment of the lamination body on which the terminal electrodes 12a, 12b have been placed is performed. The annealing treatment may be performed in a reduced-pressure environment, at a temperature of 200 to 400° C.

Here, "reduced-pressure environment" means an environment having a pressure lower than one atmosphere (=101325 Pa). By performing annealing treatment, the electrical characteristics can be stabilized.

After removing at least a portion of the cover layer 14 and forming vias, the cover layer 14 is further covered by a polyimide or other insulating protective layer 18, prior to forming the terminal electrodes 12a, 12b. By covering the cover layer with an insulating protective layer 18, leakage currents between the cover layer and the terminal electrodes 12a, 12b are suppressed. By this means, the thin film capacitor 100 of this embodiment, shown in FIG. 1, is obtained.

By means of the above method of manufacturing a thin film capacitor 100, the lamination body 100a comprising the upper electrode layer 10a is formed (S11), and after further deposition of a cover film 14a (S13), sintering is performed (S14). Hence in the above manufacturing method, sintering is performed without oxidation of the upper electrode 10 or the internal electrode 8. In this case, there is no occurrence of oxidized regions on the surfaces in the deposition direction of the upper electrode 10 and internal electrode 8, so that the electrostatic capacitance of the thin film capacitor 100 is increased. Consequently the oxide film removal process of removing oxide film formed through sintering can be omitted, and a thin film capacitor 100 with excellent characteristics can be manufactured by a more simple method.

Further, as described in the above embodiment, when the cover layer 14 and the dielectric layers 4, 6 comprise material with the same composition, stresses occurring in the case of materials with different compositions are reduced, so that separation between layers, increases in leakage currents, and similar in the thin film capacitor 100 arising from stresses can be reduced, and a thin film capacitor 100 with still more excellent characteristics can be manufactured.

(Second Embodiment)

Thin Film Capacitor 200

Figure 4:
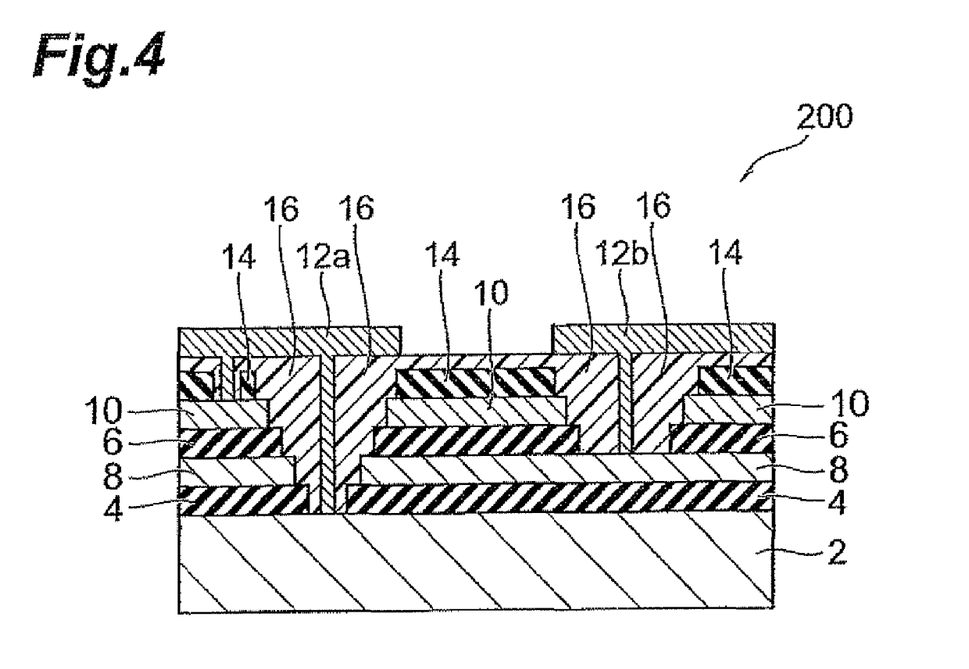
FIG. 4 is a summary cross-sectional view of the thin film capacitor of a second embodiment of the invention.

Next, the thin film capacitor 200 of a second embodiment of the invention will be described. FIG. 4 is a summary cross-sectional view of the thin film capacitor 200 of this embodiment. The thin film capacitor 200 of this embodiment differs from the thin film capacitor 100 of the first embodiment in the following respects. That is, in the thin film capacitor 100, the cover layer 14 is formed so as to surround the periphery of the vias of the terminal electrodes 12a, 12b, and the cover layer 14 is in contact not only with the upper electrode 10, but with the dielectric layers 4, 6 and the internal electrode 8 as well. On the other hand, in the thin film capacitor 200 of this embodiment, the cover layer 14 is placed only on the upper face of the upper electrode 10. Further, an insulating protective layer 16 is provided on the periphery of the via electrically connecting the terminal electrode 12a and the base electrode 2, on the periphery of the via electrically connecting the terminal electrode 12b and the internal electrode 8, and on the surface of the cover layer 14.

As the insulating protective layer 16, for example a polyimide is preferable. However, this insulating protective layer 16 is provided after sintering the lamination body comprising the upper electrode. Hence no limitations in particular are placed on the material used in the insulating protective layer 16, other than being an insulating material.

Method of Manufacture of Thin Film Capacitor 200

Figure 5:
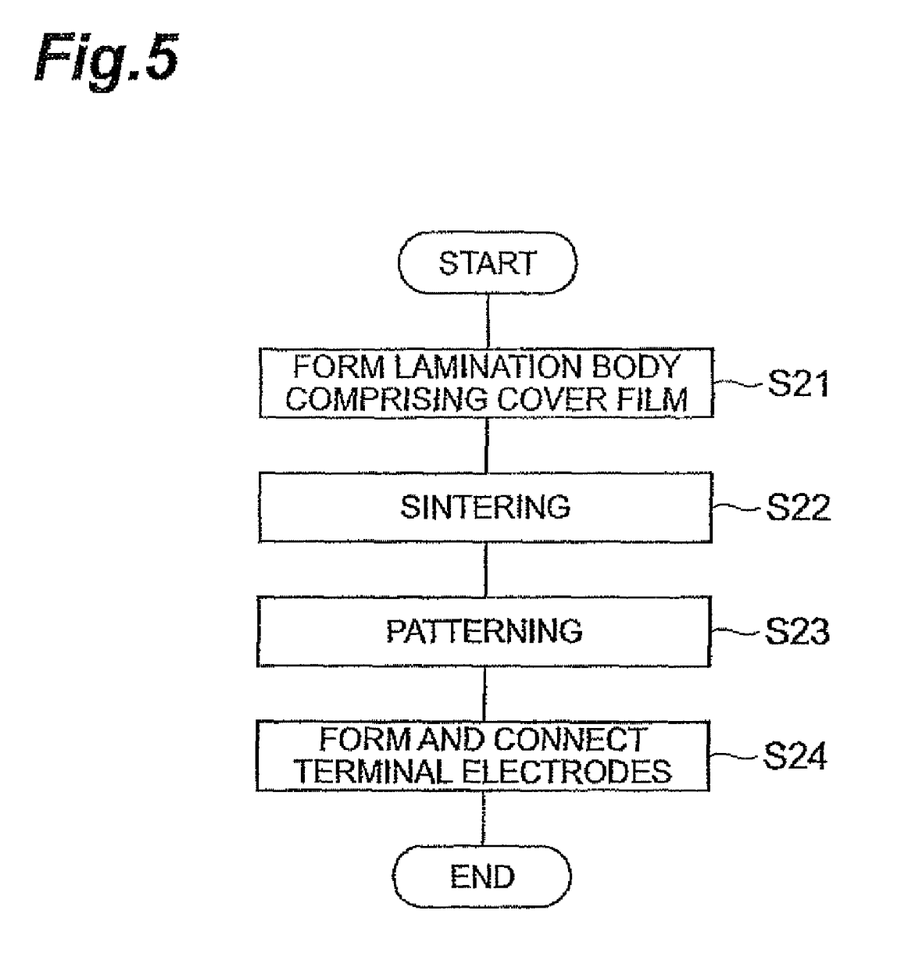
FIG. 5 is a flowchart explaining a method of manufacturing the thin film capacitor of the second embodiment of the invention.
Figure 6:
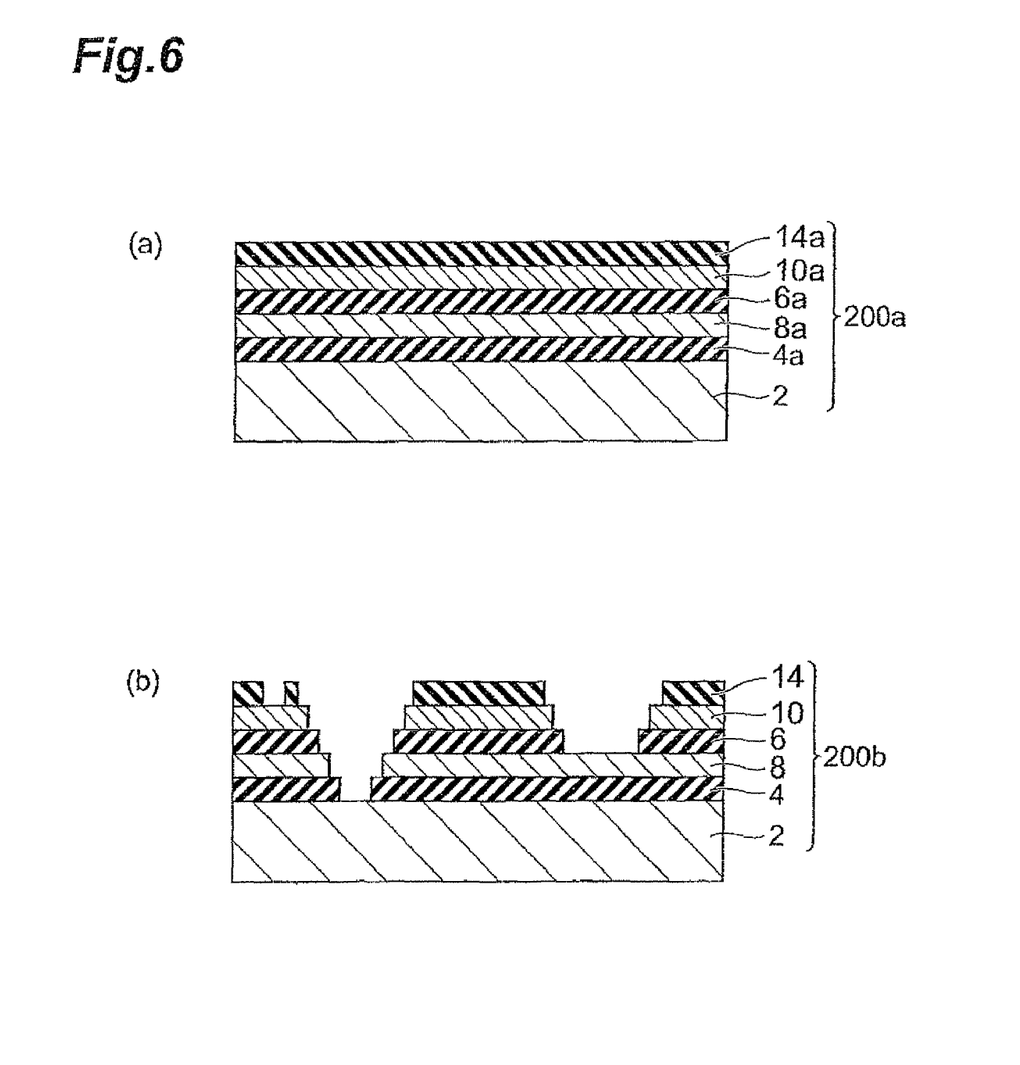
FIG. 6 shows summary cross-sectional views, in (a), (b) and (c), of a method of manufacturing the thin film capacitor shown in FIG. 4.

Next, a method of manufacturing the thin film capacitor 200 of this embodiment will be described with reference to FIG. 5 and FIG. 6. In the following description, differences with the method of manufacturing the thin film capacitor 100 will be mainly described. FIG. 5 is a flowchart explaining the method of manufacturing the thin film capacitor 200 shown in FIG. 4. And, (a) and (b) in FIG. 6 are summary cross-sectional views showing the method of manufacturing a thin film capacitor 200 shown in FIG. 5. As shown in FIG. 5, the method of manufacturing the thin film capacitor 200 comprises a process of forming a lamination body comprising a cover film (S21), a sintering process (S22), a patterning process (S23), and a terminal electrode formation and connection process (S24).

First, in the process to form a lamination body comprising a cover film (S21), similarly to the method of manufacturing the thin film capacitor 100, after depositing in order a base electrode 2, dielectric film 4a, internal electrode layer 8a, dielectric film 6a, and upper electrode layer 10a, as shown in (a) of FIG. 6, a cover film 14a is further deposited covering the entire surface of the upper electrode layer 10a. By this means; the lamination body (lamination component) 200a comprising the cover film 14a is formed. When depositing in order each of the layers comprised by the lamination component 200a on the upper face of the base electrode 2, full-coverage deposition is performed, rather than patterning using a mask or similar.

Next, the lamination component 200a comprising the dielectric films 4b, 6b and cover film 14a is sintered (822, sintering process). At this time, the lamination component 200a is sintered in a state in which the cover film 14a is provided on the upper face of the upper electrode layer 10a, so that oxidation of the upper face of the upper electrode layer 10a is suppressed.

Next, the sintered lamination component 200a is patterned by wet etching (S23, patterning process). In this patterning process, by using wet etching to pattern in order the cover film 14a, upper electrode layer 10a, dielectric film 6a, internal electrode layer 8a, and dielectric film 4a, the upper electrode 10, dielectric layer 6, internal electrode 8, and dielectric layer 4 are respectively formed.

Specifically, first photoresist is applied to the surface of the cover film 14a, and photolithography is used to form a mask having the pattern corresponding to the cover layer 14 comprised by the completed thin film capacitor 200; by using etching liquid to etch the cover film 14a, the cover layer 14 is formed. After forming the cover film 14, the mask covering the surface is peeled away. As the photoresist used to form the cover film 14a, for example OFPR-800 by Tokyo Ohka Kogyo Co., Ltd. is used. As the etching liquid used to form the cover film 14a, for example an aqueous solution of hydrochloric acid+ammonium fluoride can be used.

Next, after applying photoresist to the surfaces of the cover layer 14 and upper electrode layer 10a, photolithography is used to form a mask having a pattern corresponding to the upper electrode 10 comprised by the completed thin film capacitor 200, etching liquid is used to etch the upper electrode layer 10a, and the upper electrode 10 is fowled. After forming the upper electrode 10, the mask covering the surfaces of the cover layer 14 and upper electrode 10 is removed. As the photoresist used to form the upper electrode 10, for example OFPR-800 by Tokyo Ohka Kogyo Co., Ltd. is used As the etching liquid used to form the upper electrode 10, any etching liquid which erodes the upper electrode layer 10a, and moreover does not erode the dielectric film 6a adjacent to the upper electrode layer 10a or the mask, maybe used; for example, when the upper electrode layer 10a is a layer comprising Ni as the main component, an aqueous solution of iron chloride ($FeCl_3$) can be used.

Next, after applying photoresist to the surfaces of the cover layer 14, upper electrode 10, and dielectric film 6a, photolithography is used to form a mask having a pattern corresponding to the dielectric layer 6 comprised by the completed thin film capacitor 200, etching liquid is used to etch the dielectric film 6a, and the dielectric layer 6 is formed. After forming the dielectric layer 6, the mask covering the surfaces of the cover layer 14, upper electrode 10, and dielectric layer 6 is removed. As the photoresist used to form the dielectric layer 6, for example OFPR-800 by Tokyo Ohka Kogyo Co., Ltd. is used. As the etching liquid used to form the dielectric layer 6, for example an aqueous solution of hydrochloric acid+ammonium fluoride can be used.

Next, after applying photoresist to the surfaces of the cover layer 14, upper electrode 10, dielectric layer 6, and internal electrode layer, 8a, photolithography is used to form a mask having a pattern corresponding to the internal electrode 8 comprised by the completed thin film capacitor 200, etching liquid is used to etch the internal electrode layer 8a, and the internal electrode 8 is formed. After forming the internal electrode 8, the mask covering the surfaces of the cover layer 14, upper electrode 10, dielectric layer 6, and internal electrode 8 is removed.

Further, by repeating the above process with respect to the dielectric film 4a, the dielectric layer 4 comprised by the completed thin film capacitor 200 is formed, and the lamination body 200b shown in (b) of FIG. 6 is obtained.

And, an insulating protective layer 16 is formed so as to cover the regions in which patterning has been used to remove the dielectric layer 4, internal electrode 8, dielectric layer 6, upper electrode 10, and cover layer 14 among the lamination body 200b, as well as the surface of the cover layer 14, and in addition a pair of terminal electrodes 12a, 12b is formed on the upper face of the upper electrode 10 (S24, terminal electrode formation and connection process). One of the terminal electrodes 12a is electrically connected to the base electrode 2 and upper electrode 10 through a via, and the other terminal electrode 12b is electrically connected to the internal electrode 8 through a via. And, annealing treatment of the lamination body with terminal electrodes 12a, 12b provided is performed. By this means, the thin film capacitor 200 of this embodiment shown in FIG. 4 is obtained.

In the above-described method of manufacturing the thin film capacitor 200, after depositing the cover film 14a covering the upper face of the upper electrode layer 10a of the lamination component 200a (S21), sintering is performed (S22). Hence in the above method of manufacture, sintering is performed without oxidation of the upper electrode 10 or internal electrode 8, an oxide film removal process of removing the oxide film formed by sintering can be omitted, and a thin film capacitor 200 can be manufactured by a more simple method.

In the thin film capacitor 200 of the above embodiment, when the cover layer 14 and the dielectric layers 4, 6 comprise materials having the same composition, stresses which occurred due to differences in the materials of the cover layer and dielectric layers in the prior art can be suppressed, so that the occurrence of leakage currents, separation between films, and other phenomena thought to be due to the occurrence of stresses can be reduced, and thin film capacitors having more excellent characteristics can be manufactured.

Embodiments of the present invention were described above, but thin film capacitors and methods of manufacturing thin film capacitors of the present invention are not limited to the above embodiments, and various modifications can be made. For example, in the above embodiments, modes were described in which the plurality of dielectric layers 4, 6 and the cover layer 14, deposited above the base electrode 2, were sintered all at once; but modes may be employed in which sintering is performed any number of times (performed for each dielectric layer).

Even when performing sintering each time a dielectric film is deposited, it is preferable that, prior to sintering the uppermost dielectric film (that is, the dielectric film 6a), the upper electrode layer 10a and cover film 14a be deposited onto the dielectric film 6a, and that sintering be performed after forming the lamination component with the uppermost dielectric film unsintered. By this means, oxidation of the upper electrode layer 10a due to sintering is effectively suppressed. Even in this case, the number of sinterings can be reduced, and in addition by simultaneous high-temperature heat treatment of the dielectric film 6a, upper electrode layer 10a, and cover film 14a, these surfaces enter stable states, and the improvement of characteristics which is an advantageous result of this invention is achieved.

As described above, it is preferable that, before sintering the dielectric film which becomes the uppermost dielectric layer (that is, the dielectric film 6a), the upper electrode 10a and cover film 14a be deposited on the dielectric layer 6a to form the lamination body, after which sintering is performed; however, a mode may also be employed in which the uppermost dielectric film is already sintered, and a lamination component, in which the upper electrode layer which becomes the upper electrode and the cover film which becomes the cover layer are deposited in this order, is sintered. Even when the upper electrode layer 10a and cover film 14a are deposited onto the sintered dielectric film 6a to form the lamination component, after which sintering is performed, the upper electrode layer 10a is covered by the cover film 14a, so that oxidation of the upper electrode layer 10a due to sintering is also suppressed.

Further, crystallization of the upper electrode progresses due to sintering treatment to bake the upper electrode layer covered by the cover film, resulting in a more electrically stable electrode, and moreover the interface between the upper electrode (upper electrode layer) and the dielectric layer (dielectric film) is subjected to heat at high temperature, so that the junction characteristics of the interface are improved, and a thin film capacitor with excellent leak characteristics can be realized. The junction characteristics of an electrode and a dielectric layer change according to the work function of the electrode and the band structure of the dielectric layer, but by performing the heat treatment described in the above embodiment, the interface structure is optimized, and it is thought that leakage currents in the thin film capacitor can be effectively reduced.

Further, in the above embodiments description were given of configurations in which a plurality of dielectric layers 4, 6 are deposited on a base electrode 2, and an internal electrode 8 is provided between the dielectric layers 4, 6; however, the thin film capacitor may have a single dielectric layer deposited on the base electrode 2 (that is, with no internal electrode provided). In this case also, prior to sintering the single layer of the dielectric film provided on the base electrode 2, by performing sintering after depositing the upper electrode layer and cover film on the dielectric film, the advantageous result that oxidation of the upper electrode layer due to sintering is suppressed can be similarly obtained.

Figure 7:
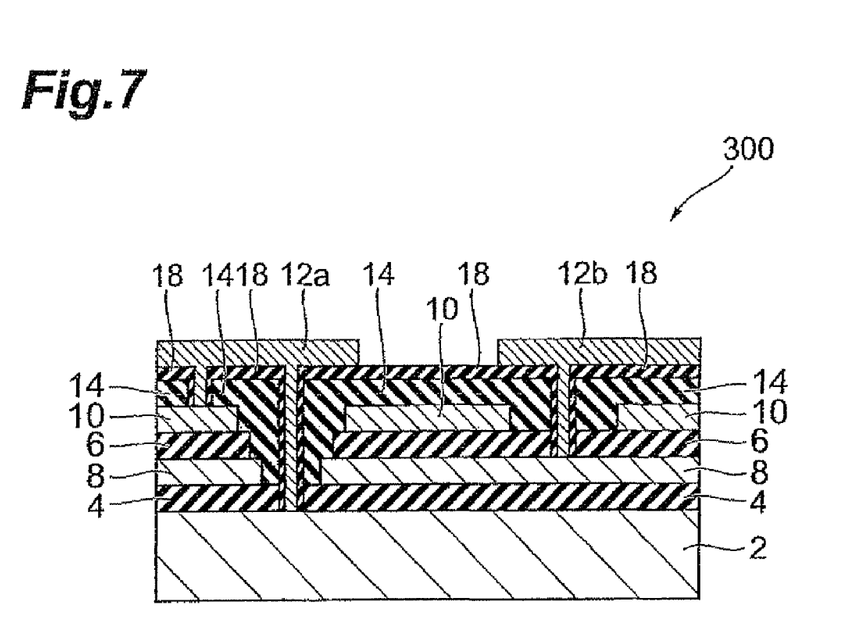
FIG. 7 is a summary cross-sectional view of the thin film capacitor which is a modified example of the thin film capacitor of the first embodiment.

Further, in the thin film capacitor 100 of the first embodiment, a configuration is employed in which a cover layer 14 is provided between the dielectric layers 4, 6 and the vias of the terminal electrodes 12a, 12b. However, a configuration can also be employed in which for example an end face of the dielectric layer 4 is directly in contact with a via extending from the terminal electrode 12a, and an end face of the dielectric layer 6 is direction in contact with a via extending from the terminal electrode 12b, as in the thin film capacitor 300 of FIG. 7. This configuration is preferred when the cover layer 14 and the dielectric layers 4, 6 comprise material of the same composition; by employing such a configuration, processing related to patterning can be reduced.

Further, in the above embodiments cases were described in which the internal electrode 8 is only a single layer; but the number of internal electrodes 8 can be increased appropriately according to the number of dielectric layers 4, 6. In this case, placement of the vias extending from the terminal electrodes 12a, 12b is modified appropriately according to the number of internal electrodes 8.

The invention will now be described in still greater detail based on practical examples and comparison examples. However, the invention is in no way limited to the following practical examples.

(Manufacture of the Thin Film Capacitor of Practical Example 1)

As Practical Example 1, the thin film capacitor 100 shown in FIG. 1 was manufactured by the following method. First, the surface of Ni foil 50 μm thick was mirror-polished to obtain the base electrode 2. Next, $BaTiO_3$ was used as a target in sputtering to deposit a $BaTiO_3$ film, to become the dielectric film 4a, on the surface of the polished Ni foil. At this time, a mask was used to form a pattern as shown in (a) of FIG. 3. In sputtering, the Ni foil temperature was held at 250° C. The thickness of the $BaTiO_3$ film was 300 nm.

Next, by performing sputtering using a target with Ni as the main component, an Ni layer was formed in a pattern on the surface of the $BaTiO_3$ film as the internal electrode layer 8a. The thickness of the internal electrode layer 8a was 200 nm. Similar repetitions were performed to faun the lamination body 100a comprising the five layers of the base electrode 2, dielectric film 4a, internal electrode layer 8a, dielectric film 6a, and upper electrode 10a.

Figure 3:
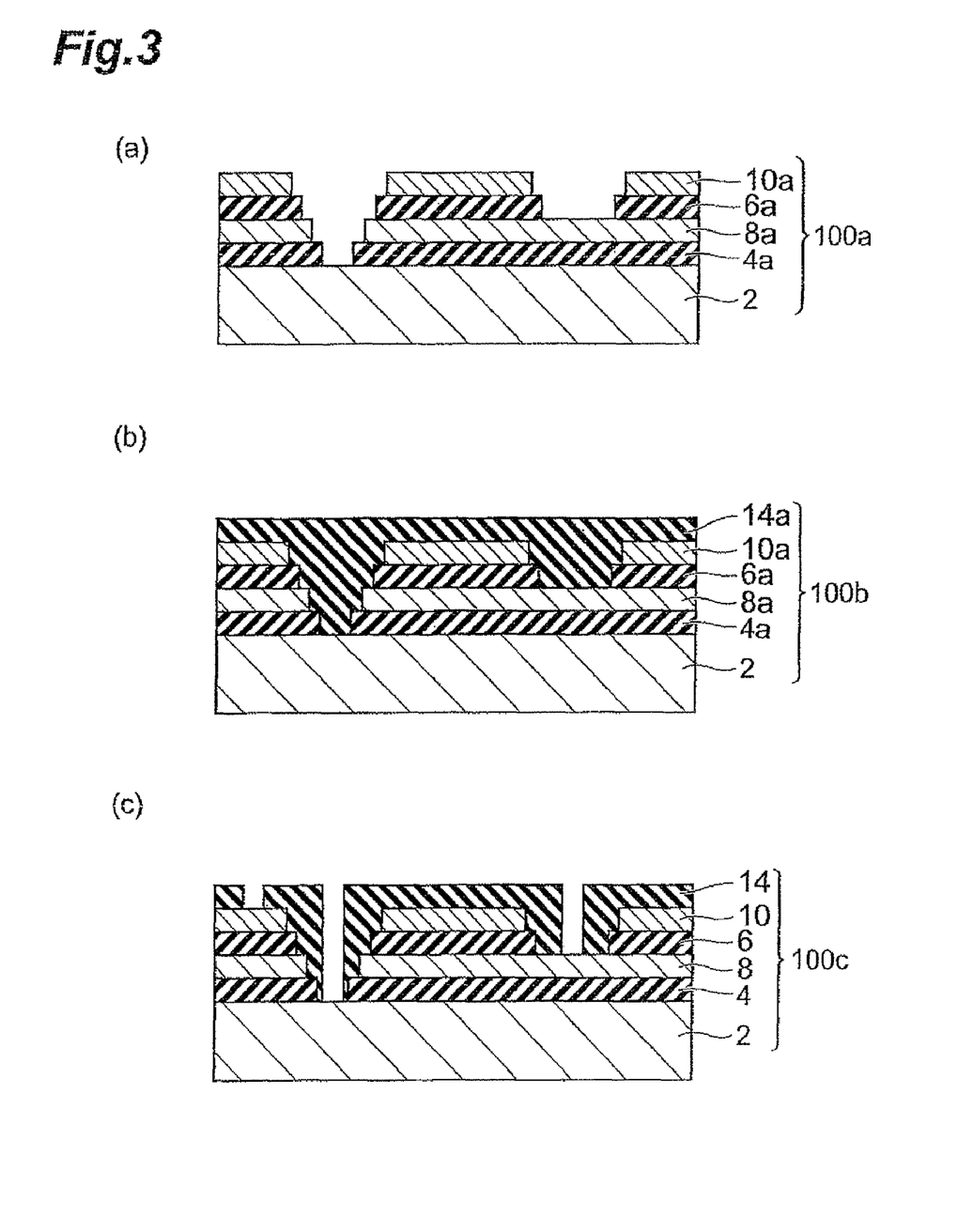
FIG. 3 shows summary cross-sectional views, in (a), (b) and (c), of a method of manufacturing the thin film capacitor shown in FIG. 1.

Next, by performing sputtering using a $BaTiO_3$ target, a $BaTiO_3$ film was deposited onto the surface of the lamination body 100a as the cover film 14a, to obtain the lamination body (lamination component) 100b shown in (b) of FIG. 3.

Next, the lamination body 100b was sintered at 800° C. in vacuum, causing crystallization of the dielectric films 4a, 6a and the cover film 14a, comprising $BaTiO_3$ films. After sintering of the lamination body, the dielectric films 4a, 6a and cover layer 14 of $BaTiO_3$ of the lamination body were wet-etched, to form, on the upper face of the cover layer 14, openings passing to the upper electrode 10, internal electrode 8, and base electrode 2, respectively, and the lamination body 100c shown in (c) of FIG. 3 was thus manufactured. In wet etching of the dielectric films 4a, 6a and the cover layer 14 comprising $BaTiO_3$ films, OFPR-800 by Tokyo Ohka Kogyo Co., Ltd. was used as the photoresist, and an aqueous solution of hydrochloric acid+ammonium fluoride was used as the etching liquid. Then, after providing an insulating protective layer 18 comprising a polyimide so as to cover the surfaces of the base electrode 2, dielectric layer 4, internal electrode 8, dielectric layer 6, upper electrode 10, and cover layer 14, sputtering was performed to form the pair of terminal electrodes 12a, 12b comprising Cu, to obtain a thin film capacitor of size 1005. One of the terminal electrodes 12a was electrically connected to the base electrode 2 and upper electrode 10 through an opening formed in the cover layer 14, and the other terminal electrode 12b was electrically connected to the internal electrode 8 through a hole formed in the cover layer 14. Next, to achieve stabilization, the lamination body 100c was annealed at 310° C. in vacuum, and the thin film capacitor 100 of Practical Example 1 was obtained.

(Manufacture of the Thin Film Capacitor of Practical Example 2)

Other than changing the material of the cover film 14a from BaTiO$_3$ to SiO$_2$, the same manufacturing method as in Practical Example 1 was used to obtain the thin film capacitor 100 of Practical Example 2. In wet etching of the cover layer 14 comprising SiO$_2$ film, OFPR-800 by Tokyo Ohka Kogyo Co., Ltd. was used as photoresist, and an aqueous solution of hydrochloric acid+ammonium fluoride was used as the etching liquid.

(Manufacture of the Thin Film Capacitor of Comparison Example 1)

As Comparison Example 1, the following method was used to manufacture a thin film capacitor in which, in the thin film capacitor 100 shown in FIG. 1, the region of the cover layer 14 was also covered by the insulating protective layer 18. First, the surface of 50 μm thick Ni foil was mirror-polished to obtain the base electrode 2. Next, by performing sputtering using a BaTiO$_3$ target, a BaTiO$_3$ film to become the dielectric film 4a was deposited onto the surface of the polished Ni foil. At this time a mask was used, to form a pattern as shown in (a) of FIG. 3. In sputtering, the Ni foil temperature was held at 250° C. The thickness of the BaTiO$_3$ film was 300 nm.

Next, by performing sputtering using a target with Ni as the main component, an Ni layer was formed in a pattern on the surface of the BaTiO$_3$ film as the internal electrode layer 8a. The thickness of the internal electrode layer 8a was 200 nm. Similar repetitions were performed to form the lamination body 100a comprising the five layers of the base electrode 2, dielectric film 4a, internal electrode layer 8a, dielectric film 6a, and upper electrode 10a.

Next, the lamination body 100a was sintered at 800° C. in vacuum, causing crystallization of the dielectric films 4a, 6a, comprising BaTiO$_3$ films. After sintering of the lamination body 100a, the surface of the upper electrode 10 was observed with a microscope, and it was confirmed that there had been rapid partial progress of oxidation and black discoloration. After sintering of the lamination body 100a, an insulating protective layer 18 comprising a polyimide was formed so as to cover the surfaces of the base electrode 2, dielectric layer 4, internal electrode 8, dielectric layer 6, and upper electrode 10, and then openings were provided in this insulating protective layer 18, and sputtering was performed to form a pair of terminal electrodes 12a, 12b comprising Cu, to obtain a thin film capacitor of size 1005. One of the terminal electrodes 12a was electrically connected to the base electrode 2 and upper electrode 10 through openings formed in the cover layer 14, and the other terminal electrode 12b was electrically connected to the internal electrode 8 through a hole formed in the cover layer 14. Next, to achieve stabilization, the lamination body 100c was annealed at 310° C. in vacuum, and the thin film capacitor 100 of Comparison Example 1 was obtained.

(Evaluation 1)

Electrostatic capacitance and leakage currents were measured for the thin film capacitors of the above Practical Examples 1 and 2 and Comparison Example 1. When measuring leakage currents, the voltage applied to each thin film capacitor was 4 V. Evaluation results are shown in Table 1. As shown in Table 1, the thin film capacitors of Practical Example 1 and Practical Example 2 were confirmed to have larger electrostatic capacitance compared with the thin film capacitor of Comparison Example 1. Also, it was confirmed that leakage currents in the capacitor of Practical Example 1 were improved by approximately five orders of magnitude compared with the thin film capacitor of Comparison Example 1, and moreover leakage currents in the thin film capacitor of Practical Example 2 were improved by approximately four orders of magnitude compared with the thin film capacitor of Comparison Example 1. That is, when sintering was performed in a state in which a cover film covered the surface of the upper electrode layer, not only was there no evidence in particular of declines in electrostatic capacitance due to oxidation of the upper electrode layer or of the occurrence of leakage currents, but leakage currents were confirmed to be greatly improved.

Further, the thin film capacitor of Practical Example 1, in which the dielectric layers and cover layer were of the same material (BaTiO$_3$), was confirmed to have increased electrostatic capacitance compared with the thin film capacitor of Practical Example 2, in which the cover layer was of SiO$_2$. Where leakage currents are concerned in particular, it was confirmed that by changing the cover layer material the leakage currents were improved by 1.5 orders of magnitude, to result in the lowest leakage currents among the practical examples. Further, in addition to the initial characteristics appearing in Table 1 below, the thin film capacitors of Practical Example 1 and Practical Example 2 were confirmed to have improved rates of change of leakage currents upon application of a voltage to the thin film capacitors for extended periods, that is, an improvement of what is normally called reliability.

TABLE 1

|  | Electrostatic capacitance | Leakage current |
| --- | --- | --- |
| Comparison Example 1 | 4.0 nF | $5.0 \times 10^{-5}$ A |
| Practical Example 1 | 10.6 nF | $3.8 \times 10^{-10}$ A |
| Practical Example 2 | 5.6 nF | $8.3 \times 10^{-9}$ A |

(Manufacture of the Thin Film Capacitor of Practical Example 3)

Next, the thin film capacitor 200 shown in FIG. 4 was manufactured by the following method. First, a 50 μm thick Ni foil was mirror-polished to obtain the base electrode 2. Next, BaTiO$_3$ was used as a target in sputtering to deposit a BaTiO$_3$ film, to become the dielectric film 4a, on the surface of the polished Ni foil (base electrode 2). In sputtering, the Ni foil temperature was held at 250° C. The thickness of the BaTiO$_3$ film was 200 nm.

Next, by performing sputtering using an Ni system metal target with Ni as the main component and further comprising 15 mol % Pd as an added element, a layer comprising an Ni system metal (internal electrode layer 8a) was formed on the surface of the BaTiO$_3$ film. The thickness of the internal electrode layer 8a was 200 nm.

Similar repetitions were performed to form a lamination body comprising the five layers of the base electrode 2, dielectric film 4a, internal electrode layer 8a, dielectric film 6a, and upper electrode 10a. Further, by performing sputtering using a BaTiO$_3$ target, a BaTiO$_3$ film was deposited as the cover film 14a, to obtain a six-layer lamination body (lamination component) 200a.

Next, the lamination component 200a was sintered at 800° C. in vacuum, causing crystallization of the three BaTiO$_3$ films, after which wet etching was performed to modify, in order, the upper electrode 10, dielectric layer 6, internal electrode 8, and dielectric layer 4, to obtain the lamination body 200b shown in (b) of FIG. 6. In wet etching of the dielectric films 4a, 6a and the cover film 14a, OFPR-800 by Tokyo Ohka Kogyo Co., Ltd. was used as the photoresist, and an aqueous solution of hydrochloric acid+ammonium fluoride was used as the etching liquid. In wet etching of the internal electrode layer 8a, OFPR-800 by Tokyo Ohka Kogyo Co., Ltd. was used as the photoresist, and an aqueous solution of iron chloride (FeCl$_3$) was used as the etching liquid.

Next, an insulating protective layer 16 comprising a polyimide was formed so as to cover the surfaces of the base electrode 2, dielectric layer 4, internal electrode 8, dielectric layer 6, upper electrode 10, and cover layer 14 of the lamination body 200b. Then, openings to the internal electrode 8 and base electrode 2 were provided in the upper face of this protective layer 16, and an opening to the upper electrode 10 was formed in the upper face of the cover layer 14 (see (b) of FIG. 6), after which sputtering was performed to form a pair of terminal electrodes 12a, 12b of Cu; in this way, a plurality of thin film capacitors of size 1005 were obtained, as shown in FIG. 4.

One of the terminal electrodes 12a was electrically connected to the upper electrode 10 through an opening formed in the cover layer 14, and was electrically connected to the base electrode 2 through an opening formed in the insulating protective layer 16; the other terminal electrode 12b was electrically connected to the internal electrode 8 through an opening formed in the insulating protective layer 16. Finally, the lamination body was annealed at 310° C. in vacuum, and the thin film capacitor 300 of Practical Example 3 was obtained.

(Manufacture of the Thin Film Capacitor of Comparison Example 2)

Figure 8:
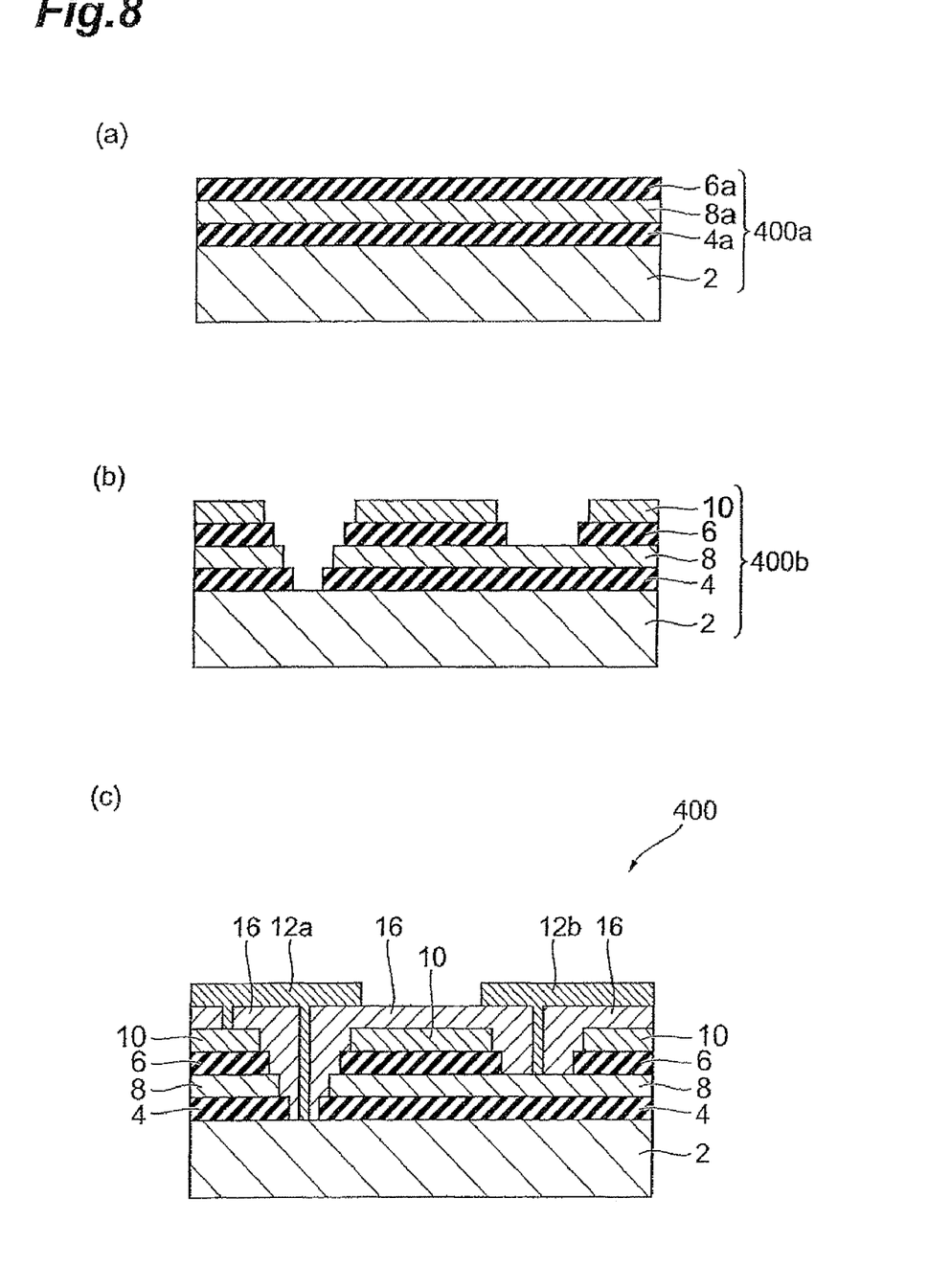
FIG. 8 shows summary cross-sectional views, in (a), (b) and (c), of a method of manufacturing the thin film capacitor of a comparison example.

The method shown in FIG. 8 was used to manufacture the thin film capacitor 400 of Comparison Example 2. That is, similarly to the method of manufacturing thin film capacitor in according to the Example 3, the surface of 50 μm thick Ni foil was mirror-polished to obtain the base electrode 2. Then, by depositing each layer thereupon, a lamination body 400a was manufactured in which four layers, which were the base electrode 2, dielectric film (BaTiO$_3$ film) 4a, internal electrode layer 8a, and dielectric film (BaTiO$_3$ film) 6a, were deposited in order ((a) of FIG. 8).

Next, the lamination body 400a was sintered at 800° C. in vacuum. After sintering of the lamination body 400a, the upper electrode layer 10a of Cu was formed on the surface positioned on the side opposite the Ni foil, and the lamination body, comprising the five layers of the base electrode 2, dielectric film 4a, internal electrode layer 8a, dielectric film 6a, and upper electrode layer 10a, was fowled. The upper electrode layer 10a was formed by sputtering using a Cu target. Then, wet etching of the lamination body was performed, to modify, in order, the upper electrode 10, dielectric layer 6, internal electrode 8, and dielectric layer 4, to obtain the lamination body 400b shown in (b) of FIG. 8. In wet etching of the Cu of the upper electrode layer 10a, OFPR-800 by Tokyo Ohba Kogyo Co., Ltd. was used as the photoresist, and an aqueous solution of ammonium persulfate was used as the etching liquid. In wet etching of the dielectric films 4a, 6a, OFPR-800 by Tokyo Ohka Kogyo Co., Ltd. was used as the photoresist, and an aqueous solution of hydrochloric acid+an fluoride was used as the etching liquid. In wet etching of the internal electrode layer 8a, OFPR-800 by Tokyo Ohka Kogyo Co., Ltd. was used as the photoresist, and an aqueous solution of iron chloride (FeCl$_3$) was used as the etching liquid.

Next, after forming an insulating protective layer 16 comprising a polyimide so as to cover the surfaces of the base electrode 2, dielectric layer 4, internal electrode 8, dielectric layer 6, and upper electrode 10 of the lamination body 400b, openings were provided in the upper face of this protective layer 16, and sputtering was performed to form a pair of terminal electrodes 12a, 12b of Cu. One of the terminal electrodes 12a, 12b was electrically connected to the base electrode 2 and upper electrode 10 through openings formed in the insulating protective layer 16, and the other terminal electrode 12b was electrically connected to the internal electrode 8 through an opening formed in the insulating protective layer 16. Finally, the lamination body was annealed at 310° C. in vacuum, and the thin film capacitor 400 of Comparison Example 2 shown in (c) of FIG. 8 was obtained.

(Evaluation 2)

Electrostatic capacitance and leakage currents were measured for the thin film capacitors of the above Practical Example 3 and Comparison Example 2. When measuring leakage currents, the voltage applied to each thin film capacitor was 4 V. Evaluation results are shown in Table 2. As shown in Table 2, the thin film capacitor of Practical Example 3 was confirmed to have an electrostatic capacitance equal to or somewhat increased compared with the thin film capacitor of Comparison Example 2. Further, it was confirmed that leakage currents in the thin film capacitor of Practical Example 3 were improved by approximately one order of magnitude compared with the thin film capacitor of Comparison Example 2. That is, when sintering was performed in a state in which the surface of the upper electrode layer was covered by a cover film, not only was there no evidence in particular of declines in electrostatic capacitance due to oxidation of the upper electrode layer or of the occurrence of leakage currents, but leakage currents were confirmed to be greatly improved. Further, in addition to the initial characteristics appearing in Table 2 below, the thin film capacitor of Practical Example 3 was confirmed to have improved rates of change of leakage currents upon application of a voltage to the thin film capacitors for extended periods, that is, an improvement of what is normally called reliability, compared with Comparison Example 2. This is thought to be because in the thin film capacitor of Practical Example 3, the dielectric films and the electrodes were subjected to heat treatment at high temperatures simultaneously in order to crystallize the dielectric films, so that these interfaces had entered a stable state.

TABLE 2

|  | Electrostatic capacitance | Leakage current |
| --- | --- | --- |
| Practical Example 3 | 23.6 nF | $1.0 \times 10^{-9}$ A |
| Comparison Example 2 | 20.4 nF | $2.0 \times 10^{-8}$ A |

(Manufacture of the Thin Film Capacitor of Practical Example 4)

Figure 9:
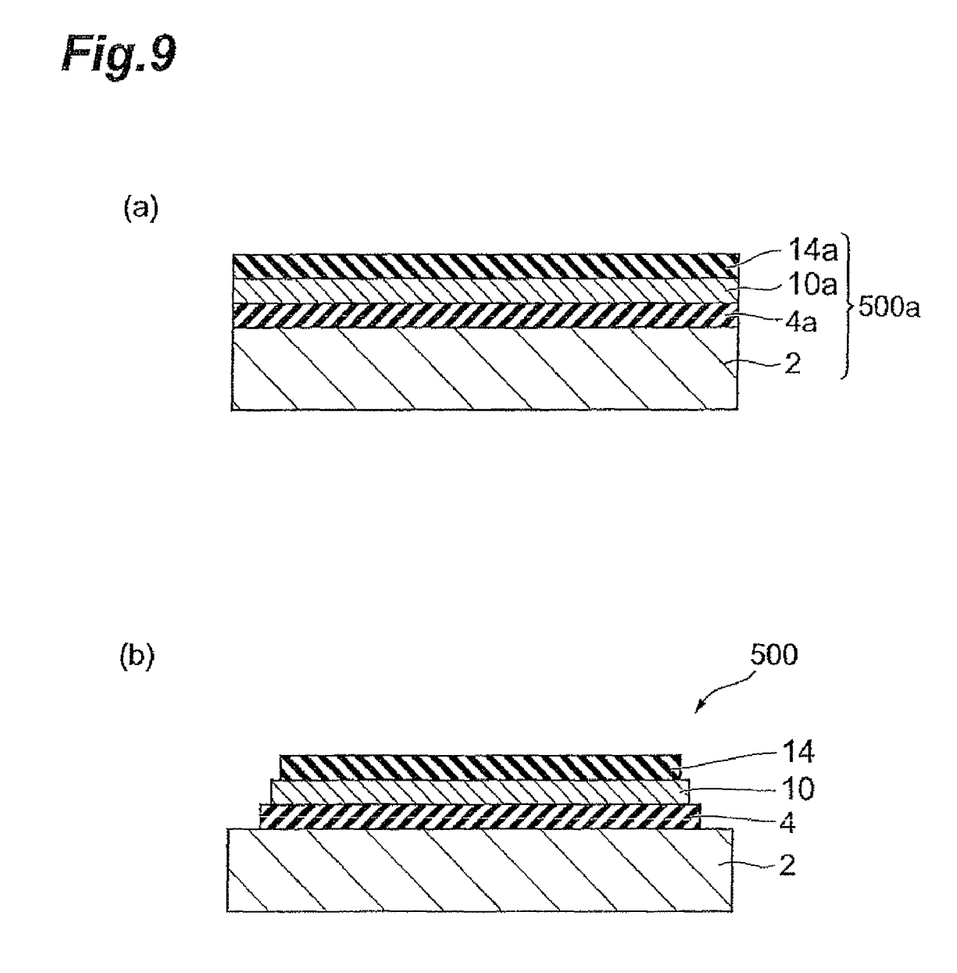
FIG. 9 shows summary cross-sectional views, in (a) and (b), of a method of manufacturing the thin film capacitor of Practical Example 4.

Next, the thin film capacitor 500 shown in (b) of FIG. 9 was manufactured by the following method. First, a 50 μm thick Ni foil was mirror-polished to obtain the base electrode 2. Next, BaTiO$_3$ was used as a target in sputtering to deposit a BaTiO$_3$ film, to become the dielectric film 4a, on the surface of the polished Ni foil (base electrode 2). In sputtering, the Ni foil temperature was held at 250° C. The thickness of the BaTiO$_3$ film was 200 nm.

Next, the base electrode 2 and dielectric film 4a were sintered at 800° C., causing sintering of the dielectric film 4a comprising BaTiO$_3$.

Next, by performing sputtering using an Ni system metal target with Ni as the main component and further comprising 15 mol % Pd as an added element, a layer comprising an Ni system metal (upper electrode layer 10a) was formed on the surface of the BaTiO$_3$ film. The thickness of the upper electrode layer 10a was 200 nm. Further, by sputtering using a BaTiO$_3$ target, a BaTiO$_3$ film was deposited as the cover film 14a, to obtain a lamination body (a lamination component) 500a comprising four layers as shown in (a) of FIG. 9.

Next, the lamination body 500a was sintered at 800° C. in vacuum, causing sintering of the BaTiO$_3$ films, and wet etching was then performed to modify in order the upper electrode 10 and dielectric layer 4, to obtain a lamination body similar to the thin film capacitor 500 in (b) of FIG. 9. In wet etching of the dielectric film 4a and cover film 14a, OFPR-800 by Tokyo Ohka Kogyo Co., Ltd. was used as the photoresist, and an aqueous solution of hydrochloric acid+ammonium fluoride was used as the etching liquid. In wet etching of the upper electrode layer 10a, OFPR-800 by Tokyo Ohka Kogyo Co., Ltd. was used as the photoresist, and an aqueous solution of iron chloride (FeCl$_3$) was used as the etching liquid.

This lamination body functions as a capacitor between the base electrode 2 and the upper electrode 10 (upper electrode layer 10a). Finally, the lamination body was annealed at 310° C. in vacuum, and the thin film capacitor 500 of Practical Example 4 shown in (b) of FIG. 9 was obtained.

(Manufacture of the Thin Film Capacitor of Comparison Example 3)

Figure 10:
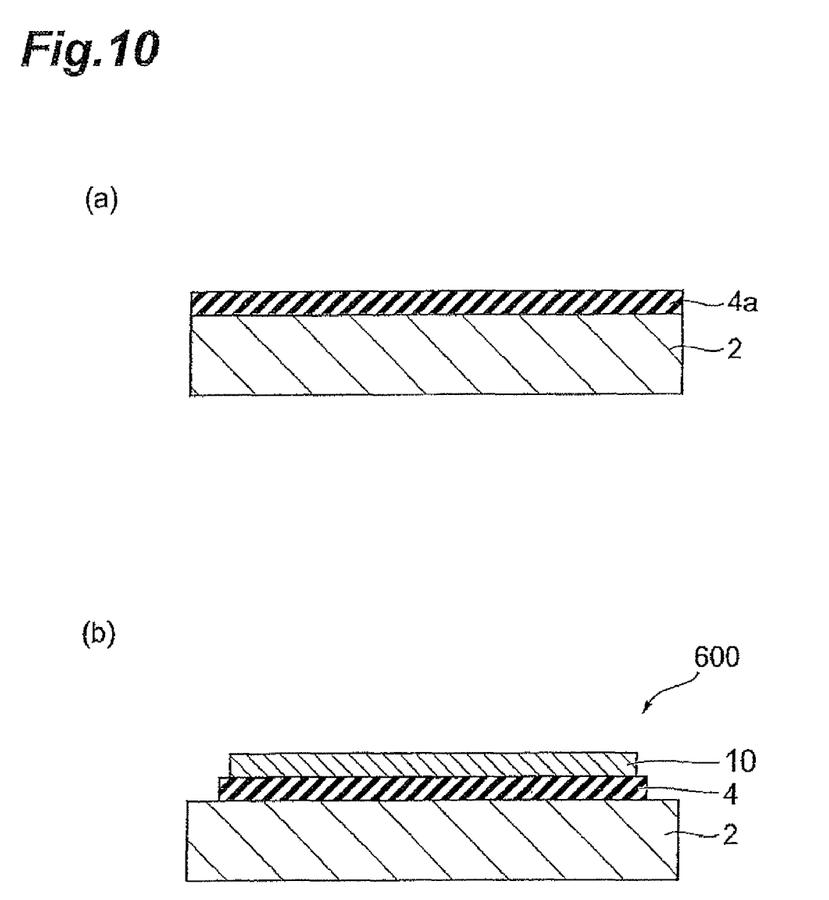
FIG. 10 shows summary cross-sectional views, in (a) and (b), of a method of manufacturing the thin film capacitor of Comparison Example 3.

Next, the following method was used to manufacture the thin film capacitor 600 of Comparison Example 3 shown in (b) of FIG. 10. That is similarly to the thin film capacitor 500 of Practical Example 4, the surface of 50 μm thick Ni foil was mirror-polished to obtain the base electrode 2. Next, BaTiO$_3$ was used as a target in sputtering to deposit a BaTiO$_3$ film, to become the dielectric film 4a, on the surface of the polished Ni foil (base electrode 2). In sputtering, the Ni foil temperature was held at 250° C. The thickness of the BaTiO$_3$ film was 200 nm. Then, this film structure was sintered at 800° C., to cause sintering of the BaTiO$_3$ film.

Next, by performing sputtering using an Ni system metal target with Ni as the main component and further comprising 15 mol % Pd as an added element, a layer comprising an Ni system metal (upper electrode layer 10a) was formed on the surface of the BaTiO$_3$ film. The thickness of the upper electrode layer 10a was 200 nm.

Next, wet etching was performed to modify in order the upper electrode layer 10a and dielectric film 4a, to obtain a lamination body in which are deposited in order the base electrode 2, dielectric film 4a, and upper electrode layer 10a, similar to the thin film capacitor 600 of (b) in FIG. 10. In wet etching of the upper electrode layer 10a, OFPR-800 by Tokyo Ohka Kogyo Co., Ltd. was used as the photoresist, and an aqueous solution of iron chloride (FeCl$_3$) was used as the etching liquid. In wet etching of the dielectric film 4a, OFPR-800 by Tokyo Ohka Kogyo Co., Ltd. was used as the photoresist, and an aqueous solution of hydrochloric acid+ammonium fluoride was used as the etching liquid.

After the above wet etching, the lamination body became a capacitor by means of the base electrode 2 and upper electrode 10 (upper electrode layer 10a). Finally, the lamination body was annealed at 310° C. in vacuum, and the thin film capacitor 600 of Comparison Example 3 shown in (b) of FIG. 10 was obtained.

(Evaluation 3)

Electrostatic capacitance and leakage currents were measured for the thin film capacitors of the above Practical Example 4 and Comparison Example 3. Specifically, by bringing measurement probes into contact with the base electrode 2 and upper electrode 10 of the thin film capacitor 500 of Practical Example 4, and with the base electrode 2 and upper electrode 10 of the thin film capacitor 600 of Comparison Example 3, electrical characteristics were evaluated. When measuring leakage currents, the voltage applied to each thin film capacitor was 4 V.

Evaluation results are shown in Table 3. As shown in Table 3, the thin film capacitor of Practical Example 4 was confirmed to have an electrostatic capacitance equal to or increased compared with the thin film capacitor of Comparison Example 3. Further, it was confirmed that leakage currents in the thin film capacitor of Practical Example 4 were improved by approximately two orders of magnitude compared with, the thin film capacitor of Comparison Example 3. That is, when sintering was performed in a state in which a cover film covered the surface of the upper, electrode layer, not only was there no evidence in particular of declines in electrostatic capacitance due to oxidation of the upper electrode layer or of the occurrence of leakage currents, but leakage currents were confirmed to be greatly improved. Further, in addition to the initial characteristics appearing in Table 3 below, the thin film capacitor of Practical Example 4 was confirmed to have improved rates of change of leakage currents upon application of a voltage to the thin film capacitors for extended periods, that is, an improvement of what is normally called reliability, compared with Comparison Example 3. This is thought to be because in the thin film capacitor of Practical Example 4, treatment at high temperature caused crystallization of the upper electrode to proceed, resulting in a more electrically stable electrode, and in addition the interface between the upper electrode and the dielectric layer was subjected to heat at high temperatures, so that the junction characteristics of the interface were improved.

TABLE 3

|  | Electrostatic capacitance | Leakage current |
| --- | --- | --- |
| Practical Example 4 | 13.5 nF | $3.0 \times 10^{-9}$ A |
| Comparison Example 3 | 10.4 nF | $3.0 \times 10^{-7}$ A |

What is claimed is:

1. A thin film capacitor, comprising a base electrode, a dielectric layer deposited on the base electrode, an upper electrode deposited opposite the base electrode with the dielectric layer being interposed therebetween, and a cover layer deposited on the upper electrode,
    wherein the thin film capacitor is formed by sintering a lamination component; and
    wherein the lamination component is formed by depositing an upper electrode layer which is to be the upper electrode and a cover film which is to be the cover layer on an unsintered dielectric film which is to be the dielectric layer.

2. The thin film capacitor according to claim 1, wherein the cover layer comprises material of the same composition as the dielectric layer.

3. The thin film capacitor according to claim 1, further comprising a terminal electrode, which is provided after patterning the sintered lamination component.

\* \* \* \* \*